(12) United States Patent
Bu et al.

(10) Patent No.: US 8,035,173 B2
(45) Date of Patent: Oct. 11, 2011

(54) CMOS TRANSISTORS WITH DIFFERENTIAL OXYGEN CONTENT HIGH-K DIELECTRICS

(75) Inventors: Huiming Bu, Ossining, NY (US); Eduard A. Cartier, New York, NY (US); Bruce B. Doris, Brewster, NY (US); Young-Hee Kim, Mohegan Lake, NY (US); Barry Linder, Hastings-on-Hudson, NY (US); Vijay Narayanan, New York, NY (US); Vamsi K. Paruchuri, Albany, NY (US); Michelle L. Steen, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/712,371

(22) Filed: Feb. 25, 2010

(65) Prior Publication Data

US 2010/0148273 A1 Jun. 17, 2010

Related U.S. Application Data

(62) Division of application No. 11/763,047, filed on Jun. 14, 2007, now Pat. No. 7,696,036.

(51) Int. Cl.
*H01L 29/78* (2006.01)

(52) U.S. Cl. ........ 257/410; 257/407; 257/E29.132; 257/E29.154; 257/E29.158

(58) Field of Classification Search .......... 257/410, 257/E29.132, E29.154, E29.158, 407
See application file for complete search history.

(56) References Cited

U.S. PATENT DOCUMENTS

| | | | |
|---|---|---|---|
| 6,489,207 B2 | 12/2002 | Furukawa et al. | |
| 6,784,508 B2 * | 8/2004 | Tsunashima et al. | 257/411 |
| 6,790,719 B1 | 9/2004 | Adetutu et al. | |
| 7,064,027 B2 | 6/2006 | Ng et al. | |
| 2004/0023478 A1 * | 2/2004 | Samavedam et al. | 438/592 |
| 2007/0037343 A1 | 2/2007 | Colombo et al. | |
| 2007/0278584 A1 | 12/2007 | Colombo et al. | |
| 2008/0099859 A1 | 5/2008 | Watanabe | |
| 2008/0272438 A1 | 11/2008 | Doris et al. | |

OTHER PUBLICATIONS

Akiyama, K., et al., "VFB Roll-off in HfO2 Gate Stack after High Temperature Annealing Process—A Crucial Role of Out-diffused Oxygen from HfO2 to Si", 2007 Symposium on VLSI Technology Digest of Technical Papers, pp. 72-73.

Cartier, E., et al., "Role of Oxygen Vacancies in VFB/Vt stability of pFET metals on HfO2", 2005 Symposium on VLSI Technology Digest of Technical Papers, pp. 230-231.

Shiraishi, K., et al., "Physics in Fermi Level Pinning at the PolySi/Hf-based High-k Oxide Interface" 2004 Symposium on VLSI Technology Digest of Technical Papers, pp. 108-109.

* cited by examiner

*Primary Examiner* — Toniae Thomas
(74) *Attorney, Agent, or Firm* — Scully, Scott, Murphy & Presser, P.C.; Louis J. Percello, Esq.

(57) ABSTRACT

An NFET containing a first high-k dielectric portion and a PFET containing a second high-k gate dielectric portion are formed on a semiconductor substrate. A gate sidewall nitride is formed on the gate of the NFET, while the sidewalls of the PFET remain free of the gate sidewall nitride. An oxide spacer is formed directly on the sidewalls of a PFET gate stack and on the gate sidewall nitride on the NFET. After high temperature processing, the first and second dielectric portions contain a non-stoichiometric oxygen deficient high-k dielectric material. The semiconductor structure is subjected to an anneal in an oxygen environment, during which oxygen diffuses through the oxide spacer into the second high-k dielectric portion. The PFET comprises a more stoichiometric high-k dielectric material and the NFET comprises a less stoichiometric high-k dielectric material. Threshold voltages of the PFET and the NFET are optimized by the present invention.

12 Claims, 12 Drawing Sheets

US 8,035,173 B2

CMOS TRANSISTORS WITH DIFFERENTIAL OXYGEN CONTENT HIGH-K DIELECTRICS

CROSS REFERENCE TO RELATED APPLICATION

This application is a divisional of U.S. patent application Ser. No. 11/763,047, filed Jun. 14, 2007, the entire content and disclosure of which is incorporated herein by reference.

FIELD OF THE INVENTION

The present invention generally relates to semiconductor devices, and particularly to semiconductor devices having differential oxygen content high-k dielectrics between p-type MOSFETs and n-type MOSFETs, and methods of manufacturing the same.

BACKGROUND OF THE INVENTION

High gate leakage current of nitrided silicon dioxide and depletion effect of polysilicon gate electrodes limits the performance of conventional silicon oxide based gate electrodes. High performance devices for an equivalent oxide thickness (EOT) less than 1 nm require high dielectric constant (high-k) gate dielectrics and metal gate electrodes to limit the gate leakage current and provide high on-currents. Since high-k dielectric materials need to be stable in contact with silicon at a temperature high enough to activate electrical dopants, only a handful of materials are known to be practically useful as a high-k gate dielectric. These include $ZrO_2$, $HfO_2$, other dielectric metal oxides, alloys thereof, and their silicate alloys.

A high-k dielectric material needs to provide good electrical stability, that is, the amount of charge trapped in the high-k dielectric material needs to remain at a low level even after extended operation of a transistor. The high-k dielectric material needs to be scalable, that is, to provide an acceptable level of leakage and acceptable levels of electron and hole mobility at a reduced thickness, e.g., less than 1 nm. While the mechanisms for degradation of mobility associated with thin high-k dielectric materials are not fully understood, it is generally believed that trapped charge scattering and/or phonon scattering are primary causes.

In general, complementary metal oxide semiconductor (CMOS) integration requires two gate materials, one having a work function near the valence band edge of the semiconductor material in the channel and the other having a work function near the conduction band edge of the same semiconductor material. In CMOS devices having a silicon channel, a conductive material having a work function of about 4.0 eV is necessary for n-type metal oxide semiconductor field effect transistors (NMOSFETs) and another conductive material having a work function of about 5.0 eV is necessary for p-type metal oxide semiconductor field effect transistors (PMOSFETs). In conventional CMOS devices employing polysilicon gate materials, a heavily p-doped polysilicon gate and a heavily n-doped polysilicon gate are employed to address the needs. In CMOS devices employing high-k gate dielectric materials, suitable materials satisfying the work function requirements are needed. So far, identification of materials for a dual work function metal gate electrode system has presented some challenges.

One approach in implementing high-k dielectrics in CMOS devices is to employ heavily doped polysilicon materials along with high-k gate dielectric materials in the gates. A threshold voltage (Vt) offset is observed, however, when high-k gate dielectric materials are integrated with polysilicon gate electrodes, which can be as much as 600 mV for p-type metal oxide semiconductor (PMOS) devices. The source of the offset is in general believed to be oxygen vacancies, or oxygen deficiencies, as well as Fermi-level pinning due to metal-silicon bonds in the high-k gate dielectrics. While metal gate electrodes tend to mitigate the threshold voltage offset effect, no solution has been proposed to fundamentally address the Vt shift in high-k dielectric gates having a polysilicon gate conductor.

In view of the above, there exists a need for a semiconductor structure having high-k dielectric material gates and providing optimal threshold voltages to PMOSFETs and NMOSFETs, and methods of manufacturing the same.

Particularly, there exists a need for a semiconductor structure having PMOSFETs and NMOSFETs, in which the threshold voltage shift effect in PMOSFETs is eliminated or alleviated, and methods of manufacturing the same.

SUMMARY OF THE INVENTION

The present invention addresses the needs described above by providing a CMOS structure, in which PFETs and NFETs have differential oxygen content high-k gate dielectric materials and methods of manufacturing the same. Specifically, the NFETs comprise a less stoichiometric, or more oxygen deficient, high-k dielectric material, and the PFETs comprise a more stoichiometric, and less oxygen deficient, high-k dielectric material.

An n-type field effect transistor (NFET) containing a first high-k dielectric portion and a p-type field effect transistor (PFET) containing a second high-k gate dielectric portion are formed on a semiconductor substrate. A gate sidewall nitride is formed on the gate of the NFET, while the sidewalls of the PFET remain free of the gate sidewall nitride. An oxide spacer is formed directly on the sidewalls of a PFET gate stack and on the gate sidewall nitride on the NFET. After high temperature processing including source and drain activation anneal, the first and second dielectric portions contain a non-stoichiometric oxygen deficient high-k dielectric material. The semiconductor structure is subjected to an anneal in an oxygen environment, during which oxygen diffuses through the oxide spacer into the second high-k dielectric portion. The second high-k dielectric portion becomes a more stoichiometric high-k dielectric material, while the first high-k dielectric portion remains non-stoichiometric since the gate sidewall nitride blocks diffusion of oxygen into the first high-k dielectric portion. The PFET and the NFET having optimized threshold voltages are provided by the present invention.

According to an aspect of the present invention, a semiconductor structure is provided, which comprises:

a. a first field effect transistor including:
  i. a first high-k dielectric portion vertically abutting a semiconductor substrate;
  ii. a first metal gate vertically abutting the first high-k dielectric portion;
  iii. a first silicon containing gate conductor vertically abutting the first metal gate; and
  iv. an oxide spacer laterally abutting the first metal gate and the first silicon containing gate conductor; and
b. a second field effect transistor including:
  i. a second high-k dielectric portion vertically abutting the semiconductor substrate;
  ii. a second metal gate vertically abutting the second high-k dielectric portion;
  iii. a second silicon containing gate conductor vertically abutting the second metal gate; and iv. a gate sidewall nitride laterally abutting the second metal gate and the second silicon containing gate conductor, wherein the second high-k dielectric portion is more stoichiometric than the first high-k dielectric portion.

The first field effect transistor may be an n-type field effect transistor and the second field effect transistor may be a p-type transistor.

In one embodiment, the first high-k dielectric portion comprises a first dielectric metal oxide containing a metal and the second high-k dielectric portion comprises a second dielectric metal oxide containing the same metal.

In another embodiment, the second dielectric metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha, \beta, \gamma, \delta, \in, \zeta, \eta$, and $\theta$ is from about 0.975 to 1.0, wherein the first dielectric metal oxide is selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof, and wherein each $\iota, \kappa, \lambda, \mu, \nu, \xi, o$ and $\pi$ is from about 0.70 to about 0.975.

In yet another embodiment, the second dielectric metal oxide is an alloy of $SiO_2$ and a second metal oxide, wherein the second metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha, \beta, \gamma, \delta, \in, \zeta, \eta$, and $\theta$ is from about 0.975 to 1.0, wherein the first dielectric metal oxide is an alloy of $SiO_2$ and a first metal oxide, wherein the first metal oxide is selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof, and wherein each of $\iota, \kappa, \lambda, \mu, \nu, \xi, o$, and $\pi$ is from about 0.70 to about 0.975.

In still another embodiment, the second dielectric metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha, \beta, \gamma, \delta, \in, \zeta, \eta$, and $\theta$ is from about 0.90 to 1.0, wherein the first dielectric metal oxide is selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof, and wherein each of $\iota, \kappa, \lambda, \mu, \nu, \xi, o$, and $\pi$ is from about 0.70 to about 0.90.

In still yet another embodiment, the second dielectric metal oxide is an alloy of $SiO_2$ and a second metal oxide, wherein the second metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha, \beta, \gamma, \delta, \in, \zeta, \eta$, and $\theta$ is from about 0.90 to 1.0, wherein the first dielectric metal oxide is an alloy of $SiO_2$ and a first metal oxide, and wherein the first metal oxide is selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof, and wherein each of $\iota, \kappa, \lambda, \mu, \nu, \xi, o$, and $\pi$ is from about 0.70 to about 0.90.

In a further embodiment, the semiconductor structure further comprises another oxide spacer laterally abutting the gate sidewall nitride, wherein the oxide spacer and the another oxide spacer comprises the same material.

In a still further embodiment, the oxide spacer may comprise silicon oxide.

In a yet further embodiment, the gate sidewall nitride may comprise silicon nitride.

In a still yet further embodiment, each of the first metal gate and the second metal gate comprises a material selected from the group consisting of TaN, TiN, WN, TiAlN, TaCN, other conductive refractory metal nitride, and an alloy thereof.

In further another embodiment, the first metal gate and the second metal gate may comprise the same material.

In still further another embodiment, the semiconductor substrate comprises silicon and the first silicon containing gate conductor comprises heavily n-doped polysilicon and the second silicon containing gate conductor comprises heavily p-doped polysilicon.

According to another aspect of the present invention, a method of forming a semiconductor structure is provided, which comprises:
a. forming a first gate stack and a second gate stack on a semiconductor substrate, wherein the first gate stack comprises a first high-k dielectric portion vertically abutting the semiconductor substrate, and the second gate stack comprises a second high-k dielectric portion vertically abutting the semiconductor substrate;
b. forming a gate sidewall nitride directly on sidewalls of the second gate stack;
c. forming an oxide spacer directly on sidewalls of the first gate stack; and
d. subjecting the first gate stack and the second gate stack to an anneal in an oxygen environment, wherein oxygen content within the second high-k dielectric portion increases substantially, while the oxygen content of the first high-k dielectric portion does not increase substantially during the anneal.

In one embodiment, the first high-k dielectric portion comprises a first dielectric metal oxide containing a metal and the second high-k dielectric portion comprises a second dielectric metal oxide containing the same metal.

In another embodiment, the first high-k dielectric portion and the second high-k dielectric portion comprise substantially the same oxygen content during the forming of the first gate stack and the second gate stack.

In yet another embodiment, the method further comprises performing an activation anneal on the first gate stack and the second gate stack, wherein the content of oxygen in the first high-k dielectric portion and the second high-k dielectric portion decreases during the activation anneal.

In still another embodiment, the second high-k dielectric portion after the anneal comprises a material selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha, \beta, \gamma, \delta, \in, \zeta, \eta$, and $\theta$ is from about 0.975 to 1.0, wherein the first high-k dielectric portion after the anneal comprises a material selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof, and wherein each of $\iota, \kappa, \lambda, \mu, \nu, \xi, o$, and $\pi$ is from about 0.70 to about 0.975.

In still yet another embodiment, the second high-k dielectric portion after the anneal comprises an alloy of $SiO_2$ and a second metal oxide, wherein the second metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha, \beta, \gamma, \delta, \in, \zeta, \eta$, and $\theta$ is from about 0.975 to 1.0, wherein the first high-k dielectric portion after the anneal comprises an alloy of $SiO_2$ and a first metal oxide, and wherein the first metal oxide is selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof, and wherein each of $\iota, \kappa, \lambda, \mu, \nu, \xi, o$, and $\pi$ is from about 0.70 to about 0.975.

In a further embodiment, the first gate stack further comprises:
a. forming a first metal gate directly on the first high-k dielectric portion;
b. forming a second metal gate directly on the second high-k dielectric portion;
c. forming a first silicon containing gate conductor directly on the first metal gate; and d. forming a second silicon containing gate conductor directly on the second metal gate.

In an even further embodiment, the method further comprises forming another oxide spacer laterally abutting the gate sidewall nitride, wherein the oxide spacer and the another oxide spacer comprises the same material, and wherein each of the first metal gate and the second metal gate comprises a material selected from the group consisting of TaN, TiN, WN, TiAlN, TaCN, other conductive refractory metal nitride, and an alloy thereof.

DETAILED DESCRIPTION OF THE INVENTION

Figure 1:
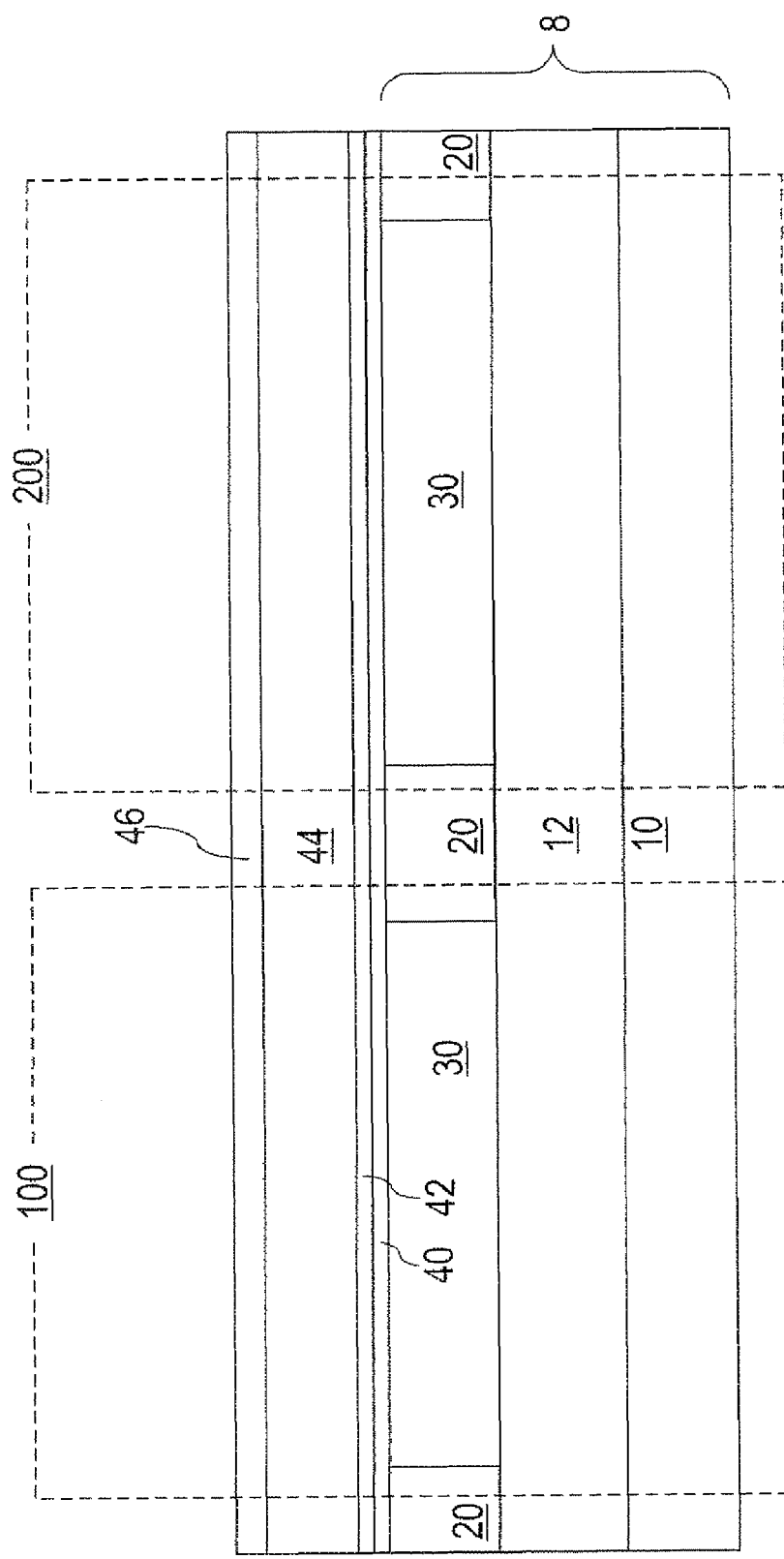
FIGS. 1-11 are sequential vertical cross-sectional views of an exemplary semiconductor structure according to the present invention at various stages of a manufacturing process.

As stated above, the present invention relates to semiconductor devices having differential oxygen content high-k dielectrics between p-type MOSFETs and n-type MOSFETs, and methods of manufacturing the same, which are now described in detail with accompanying figures. It is noted that like and corresponding elements are referred to by like reference numerals.

Referring to FIG. 1, a first exemplary semiconductor structure according to the present invention is shown, which comprises a semiconductor substrate 8 containing a handle substrate 10, a buried dielectric layer 12, and a top semiconductor layer 30. The top semiconductor layer 30 comprises a single crystalline semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon. The semiconductor substrate 8 may be a bulk substrate, a semiconductor-on-insulator (SOI) substrate, or a hybrid substrate. The semiconductor substrate 8 may have a built-in stress in the top semiconductor layer 30. While the present invention is described with an SOI substrate, implementation of the present invention on a bulk substrate or on a hybrid substrate is explicitly contemplated herein.

Shallow trench isolation 20 is formed within the top semiconductor layer 30 down to a top surface of the buried insulator layer 12. The exemplary semiconductor structure comprises a n-type field effect transistor (NFET) region 100, in which an n-type metal oxide semiconductor field effect transistor (NMOSFET) is to be formed, and a p-type field effect transistor (PFET) region 200, in which a p-type metal oxide semiconductor field effect transistor (PMOSFET) is to be formed. Each of the NFET region 100 and the PFET region 200 comprises a portion of a semiconductor substrate 8 containing a handle substrate 10, a buried insulator layer 12, and a top semiconductor layer 30. The portion of the top semiconductor layer 30 in the NFET region 100 is electrically isolated from the portion of the top semiconductor layer 30 in the PFET region 200 by shallow trench isolation 20.

A high-k dielectric layer 40 is formed on a top surface of the semiconductor substrate 8 by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc. The high-k dielectric layer 40 comprises a dielectric metal oxide having a dielectric constant that is greater than the dielectric constant of silicon oxide of 3.9. The dielectric metal oxide is a high-k material containing a metal and oxygen.

It is noted that in the description of the present invention, oxygen deficiency of 2.5% or less is considered substantially stoichiometric, while oxygen deficiency of more than 2.5% is considered non-stoichiometric.

In one embodiment, the dielectric metal oxide is a substantially stoichiometric compound. The dielectric metal oxide may be selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha, \beta, \gamma, \delta, \in, \zeta, \eta$, and $\theta$ is from about 0.975 to 1.0. In this embodiment, the oxygen deficiency of the dielectric metal oxide is from 0 to about 2.5%.

In another embodiment, the dielectric metal oxide is an alloy of $SiO_2$ and a substantially stoichiometric metal oxide, wherein the metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha, \beta, \gamma, \delta, \in, \zeta, \eta$, and $\theta$ is from about 0.975 to 1.0. In this embodiment, the oxygen deficiency of the dielectric metal oxide is from 0 to about 2.5%.

In yet another embodiment, the dielectric metal oxide is a non-stoichiometric compound. The dielectric material may be, for example, $HfO_2$, $ZrO_2$, $La_2O_3$, $Al_2O_3$, $TiO_2$, $SrTiO_3$, $LaAlO_3$, $Y_2O_3$ or an alloy thereof. In one case, the dielectric metal oxide may be selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha, \beta, \gamma, \delta, \in, \zeta, \eta$, and $\theta$ is from about 0.70 to 0.975. In this embodiment, the oxygen deficiency of the non-stoichiometric dielectric metal oxide is from about 2.5% to about 30%.

In still another embodiment, the dielectric metal oxide is an alloy of $SiO_2$ and a non-stoichiometric metal oxide, wherein the metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha, \beta, \gamma, \delta, \in, \zeta, \eta$, and $\theta$ is from about 0.70 to 0.975. In this embodiment, the oxygen deficiency of the non-stoichiometric dielectric metal oxide is from about 2.5% to about 30%.

The thickness of the high-k dielectric layer 40 may be from about 2 nm to about 6 nm, and may have an effective oxide thickness on the order of or less than 1 nm.

Preferably, only one high-k dielectric layer 40 is formed on the semiconductor substrate 8 so that the same dielectric material is employed in the NFET region 100 and in the PFET region 200. It is explicitly contemplated herein, however, that the present invention may be practiced with multiple high-k dielectric layers and/or lithographic patterning such that different dielectric metal oxides containing different metals are formed across the NFET region 100 and the PFET region 200.

A metal gate layer 42 is formed directly on the high-k dielectric layer 40, for example, by chemical vapor deposition (CVD), physical vapor deposition (PVD), atomic layer deposition (ALD), etc. The metal gate layer 42 comprises a conductive refractory metal nitride. For example, the metal gate layer 42 may comprise a material such as TaN, TiN, WN, TiAlN, TaCN, other conductive refractory metal nitride, or an alloy thereof. The thickness of the metal gate layer 42 may be from about 5 nm to about 40 nm, and preferably from about 7 nm to about 20 nm. The composition of the metal gate layer 42 may be selected to optimize threshold voltages of the NFET and the PFET to be subsequently formed in the NFET region 100 and the PFET region 200.

Preferably, only one metal gate layer 42 is formed on the semiconductor substrate 8 so that the same metal gate material is employed in the NFET region 100 and in the PFET region 200. It is explicitly contemplated herein, however, that the present invention may be practiced with multiple metal gate layers and/or lithographic patterning such that different metal gate layers are formed across the NFET region 100 and the PFET region 200.

A silicon containing gate conductor layer 44 is formed directly on the metal gate layer 42, for example, by low pressure chemical vapor deposition (LPCVD), rapid thermal chemical vapor deposition (RTCVD), etc. It is understood that an amorphous silicon containing gate conductor layer may be alternatively deposited at this point and subsequently annealed to form the silicon containing gate conductor layer 44.

The silicon containing gate conductor layer 44 may comprise a silicon containing material such as amorphous silicon, an amorphous silicon containing alloy, polysilicon and/or a polycrystalline silicon containing alloy. Exemplary silicon containing alloys are silicon germanium alloy, silicon carbon alloy, and silicon germanium carbon alloy. The silicon containing material may be doped with dopants such as B, Ga, In, P, As, and/or Sb, or may be substantially undoped. The silicon containing material may be differentially doped between the NFET region 100 and the PFET region 200. For example, the portion of the silicon containing gate conductor layer 44 in the NFET region 100 may be doped with n-type dopants, while the portion of the silicon containing gate conductor layer 44 in the PFET region 200 may be doped with p-type dopants. The thickness, i.e., the height, of the silicon containing gate conductor layer 44 may vary depending on the technique used in forming the same. The silicon containing gate conductor layer 44 may have a thickness from about 20 to about 200 nm, with a thickness from about 40 to about 150 nm being more typical.

A dielectric gate cap layer 46 is formed directly on the silicon containing gate conductor layer 44. The dielectric gate cap layer 46 comprises a dielectric material such as an oxide, such as silicon oxide, or a nitride, such as silicon nitride. Preferably, the dielectric gate cap layer 46 comprises silicon nitride. The thickness of the dielectric gate cap layer 46 may be in the range from about 20 nm to about 200 nm, with a thickness from about 40 nm to about 100 nm being more typical. The dielectric gate cap layer 46 may be formed by plasma enhanced chemical vapor deposition (PECVD), high density plasma chemical vapor deposition (HDPCVD), low pressure chemical vapor deposition (LPCVD) or rapid thermal chemical vapor deposition (RTCVD).

Figure 2:
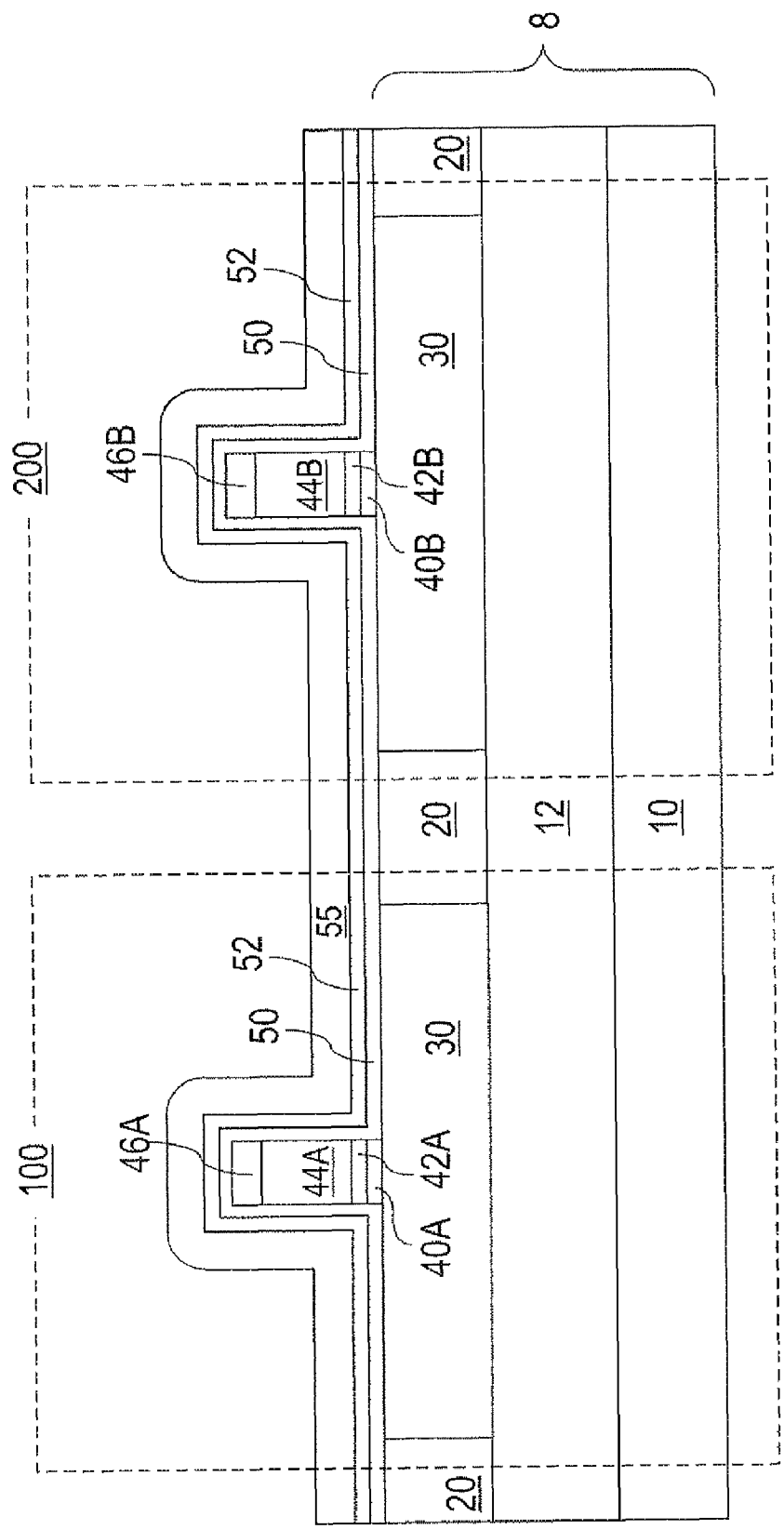

Referring to FIG. 2, a first gate stack and a second gate stack are formed in the NFET region 100 and in the PFET region 200, respectively, by lithographic patterning and a reactive ion etch. The first gate stack comprises a first high-k dielectric portion 40A, a first metal gate 42A, a first silicon containing gate conductor 44A, and a first gate cap 46A. The second gate stack comprises a second high-k dielectric portion 40B, a second metal gate 42B, a second silicon containing gate conductor 44B, and a second gate cap 46B. The first high-k dielectric portion 40A and the second high-k dielectric portion 40B are remaining portions of the high-k dielectric layer 40 in the NFET region 100 and in the PFET region 200, respectively, after the reactive ion etch. The first metal gate 42A and the second metal gate 42B are remaining portions of the metal gate layer 42 in the NFET region 100 and in the PFET region 200, respectively, after the reactive ion etch. The first silicon containing gate conductor 44A and the second silicon containing gate conductor 44B are remaining portions of the silicon containing gate conductor layer 44 in the NFET region 100 and in the PFET region 200, respectively, after the reactive ion etch. The first gate cap 46A and the second gate cap 46B are remaining portions of the dielectric gate cap layer 46 in the NFET region 100 and in the PFET region 200, respectively, after the reactive ion etch.

A gate sidewall nitride layer 50 is formed on the semiconductor substrate 8, the sidewalls of the first gate stack and the second gate stack, and top surfaces of the first gate cap 46A and the second gate cap 46B, for example, by low pressure chemical vapor deposition (CVD) or by rapid thermal chemical vapor deposition (RTCVD). The gate sidewall nitride layer 50 comprises a dielectric nitride. For example, the gate sidewall nitride layer 50 may comprise silicon nitride. The gate sidewall nitride layer 50 may, or may not, be conformal. The thickness of the gate sidewall nitride layer 50 as measured on the sidewalls of the first gate stack and the second gate stack may be from about 1.5 nm to about 10 nm, and preferably from about 2 nm to about 5 nm.

A disposable oxide layer 52 is formed on the gate sidewall nitride layer 50, for example, by low pressure chemical vapor deposition (CVD) or by rapid thermal chemical vapor deposition (RTCVD). The disposable oxide layer 52 comprises a dielectric oxide. For example, the disposable oxide layer 52 may comprise silicon oxide. The disposable oxide layer 52 may, or may not, be conformal. The thickness of the disposable oxide layer 52 as measured on vertical sidewalls of the gate sidewall nitride layer 50 on the first or second gate stacks may be from about 3 nm to about 50 nm, and preferably from about 10 nm to about 25 nm. Optionally, source and drain extension implantations and halo implantations may be performed at this step.

A disposable nitride layer 55 is formed on the disposable oxide layer 52, for example, by a chemical vapor deposition (CVD). The disposable nitride layer 55 comprises a dielectric nitride. For example, the disposable nitride layer 55 may comprise silicon nitride. The disposable nitride layer 55 may, or may not, be conformal. The thickness of the disposable nitride layer 55 as measured on vertical sidewalls of the disposable oxide layer 52 on the first or second gate stacks may be from about 10 nm to about 100 nm, and preferably from about 25 nm to about 50 nm. Optionally, source and drain implantations may be performed at this step.

Figure 3:
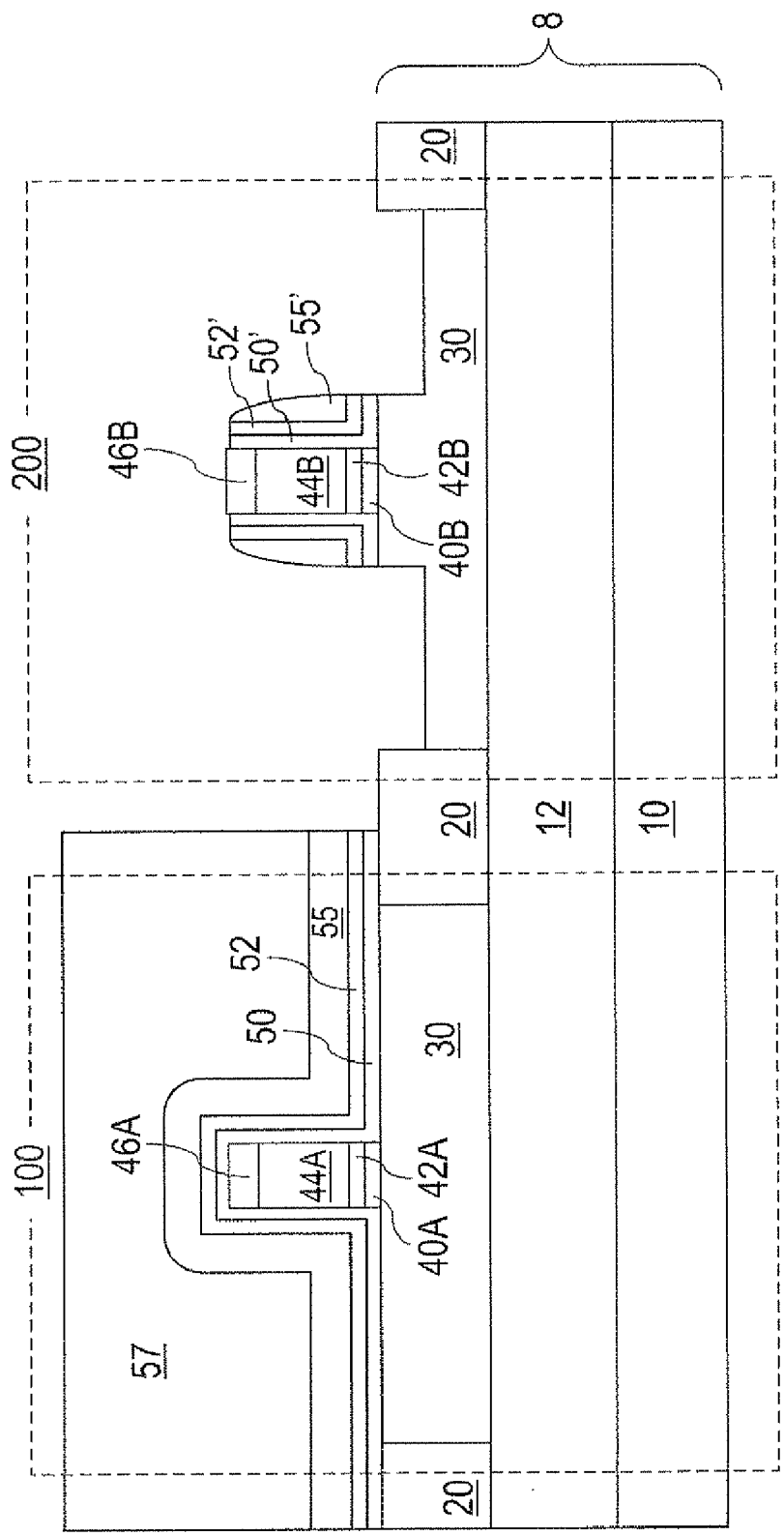

Referring to FIG. 3, a photoresist 57 is applied over the NFET region 100 and the PFET region 200 and lithographically patterned to cover the NFET region 100, while exposing the PFET region 200. The portions of the disposable nitride layer 55, the disposable oxide layer 52, and the gate sidewall nitride layer 50 over the PFET region 200 are removed by a reactive ion etch.

The reactive ion etch removes horizontal portions of the disposable nitride layer 55, the disposable oxide layer 52, and the gate sidewall nitride layer 50. The second gate cap 46B is exposed in the PFET region 200. An optional disposable nitride spacer 55', a disposable oxide spacer 52', and an L-shaped nitride spacer 50A are formed on the sidewalls of the second gate stack from the remaining portions of the disposable nitride layer 55, the disposable oxide layer 52, and the gate sidewall nitride layer 50. The maximum lateral thickness of the optional disposable nitride spacer 55' is typically about ½ of the original thickness of the disposable nitride layer 55 immediately after deposition.

In a variation of the present invention, the disposable nitride layer 55 may be removed completely from the PFET region 200 by employing an etch that is selective to the disposable oxide layer 52. In this case, the optional disposable nitride spacer 55' is not present on the exemplary semiconductor structure, while the disposable oxide spacer 52' and the L-shaped nitride spacer 50A are present.

Optionally, the exposed portions of the top semiconductor layer 30 in the PFET region 200 may be recessed. Specifically, semiconductor material may be recessed in source and drain regions of the PFET region 200. Preferably, the depth of recess is less than the thickness of the top semiconductor layer 30 so that a growth template containing a large single crystalline semiconductor surface is provided for a selective epitaxy process subsequently to be performed.

Figure 4:
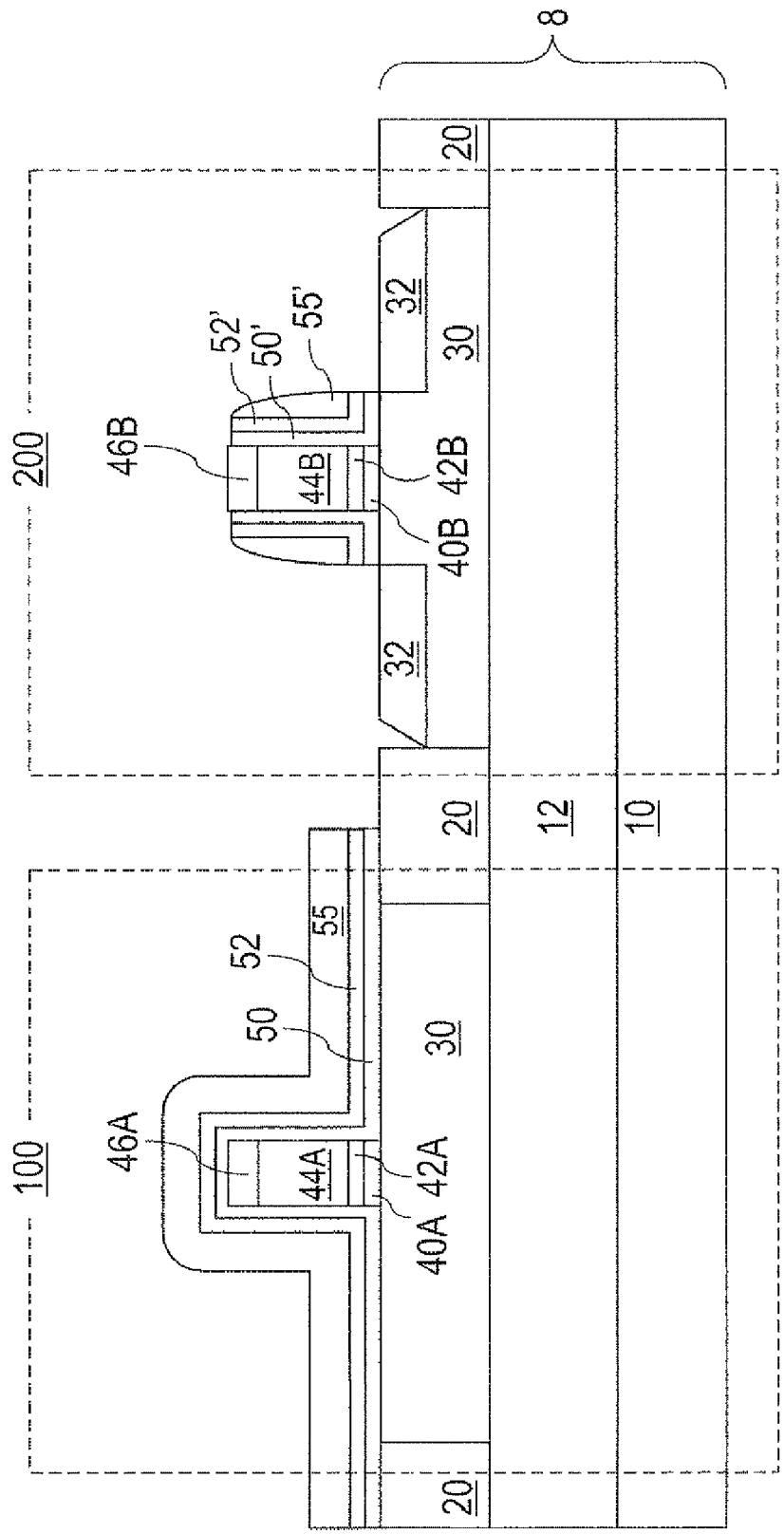

Referring to FIG. 4, the photoresist 57 is removed, for example, by ashing. The exemplary semiconductor structure may be cleaned by a wet clean at this point. Employing a selective epitaxy process or equivalent methods, embedded source and drain regions 32 comprising a stress-generating semiconductor material may be formed in the source and drain regions of the PFET region 200. For example, the top semiconductor layer 30 may be silicon and the embedded source and drain regions 32 may comprise a silicon germanium alloy. In this case, a uniaxial compressive stress is applied by the embedded source and drain regions 32 to the channel of a PFET to be subsequently formed in the PFET area 200.

In embodiments in which the top semiconductor layer 30 in the PFET region 200 is not recessed, a selective epitaxy process may be employed to form raised source and drain regions (not shown), or a selective epitaxy process may be omitted to provide level top surfaces of the semiconductor substrate 8 across the NFET region 100 and the PFET region. It is noted that a selective epitaxy process may, or may not, form crystallographic facets in the embedded source and drain regions 32 or in raised source and drain regions.

Figure 5:
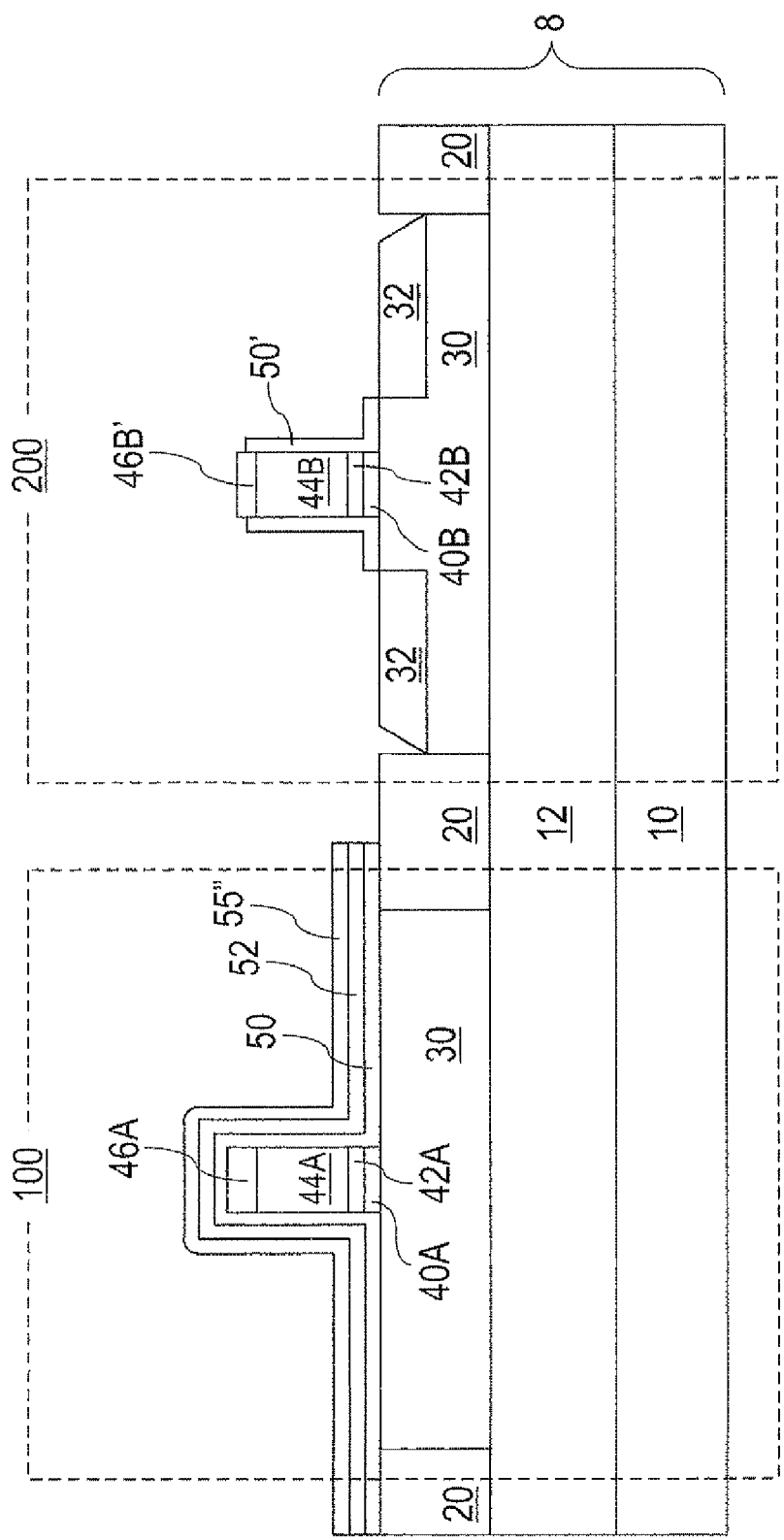

Referring to FIG. 5, the optional disposable nitride spacer 55' is removed from above the disposable oxide spacer 52' by etching if it is present. In case the disposable nitride spacer 55' comprise silicon nitride, a hot phosphoric wet etch may be employed to remove the disposable nitride spacer 55'. In case the optional disposable nitride spacer 55' is removed at this step, the remaining portion of the disposable nitride layer 55 in the NFET area 100 becomes thinner since the remaining portion of the disposable nitride layer 55 comprises the same material as the optional disposable nitride spacer 55'. Preferably, the thickness of the removed portion of the disposable nitride layer 55, i.e., the amount of removal as measured by effectively etched thickness, at this step exceeds the maximum lateral thickness of the optional disposable nitride spacer 55' and is less than the thickness of the disposable nitride layer 55. Therefore, a thinned disposable nitride layer 55" remains in the NFET region 100 of the exemplary semiconductor structure. In case the second gate cap 46B comprises silicon nitride, the second gate cap 46B may be partially etched to form a thinned second gate cap 46B', or the second gate cap 46B may be removed by the etch.

In case the disposable nitride spacer 55' is not formed in the step corresponding to FIG. 3, the etching step is omitted, in which case the disposable nitride layer 55 having substantially the same thickness as originally deposited remains in the NFET region 100. In this case, the second gate cap 46B is not thinned, but maintains the original thickness.

The disposable oxide spacer 52' is removed selective to the disposable nitride layer 55 or the thinned disposable nitride spacer 55". In case the disposable oxide spacer 52' comprises silicon oxide, a wet etch in a hydrofluoric acid may be employed to remove the disposable oxide spacer 52'.

Figure 6:
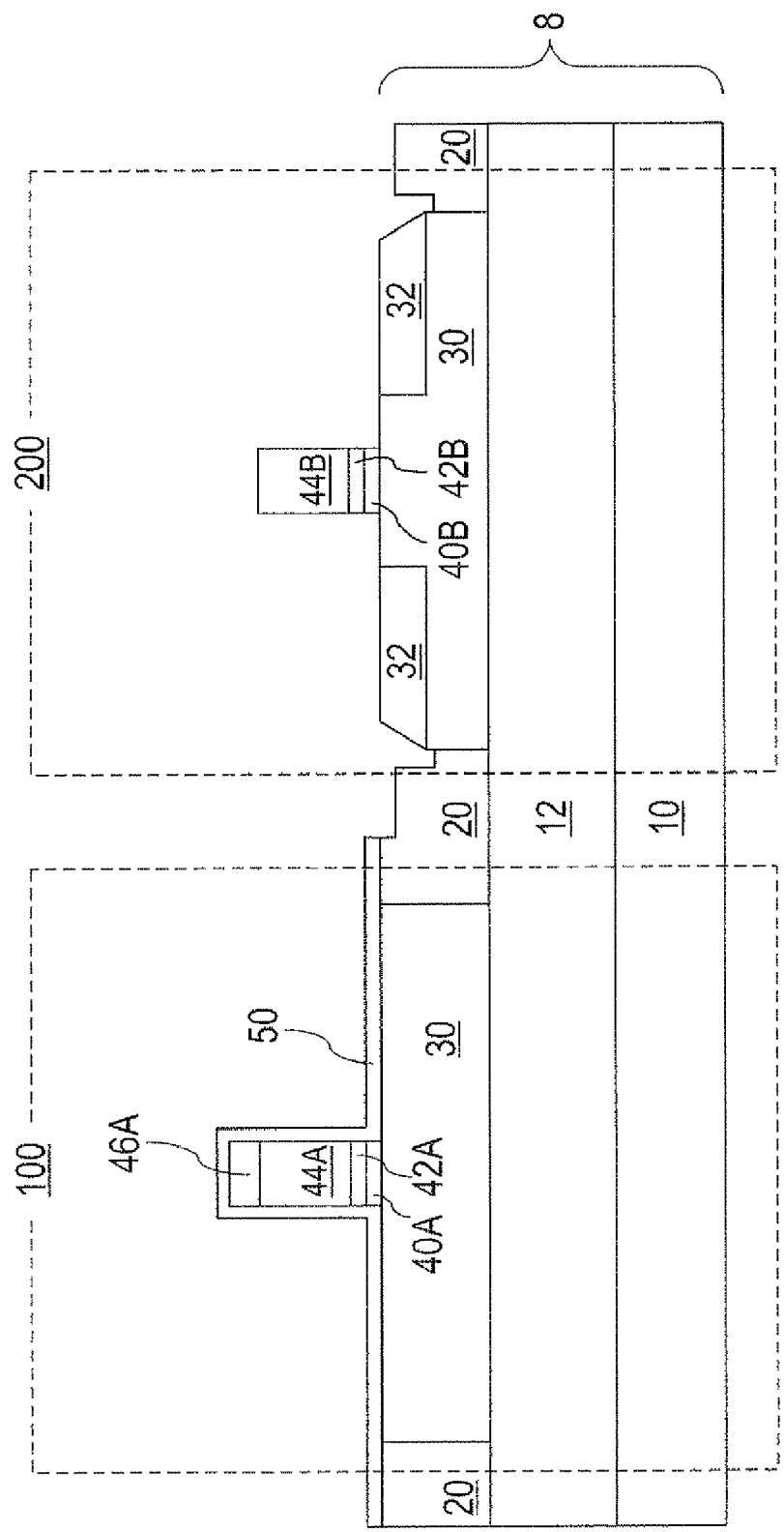

Referring to FIG. 6, the thinned second gate cap 46B' or the gate cap 46B is removed by an isotropic etch, which may be a wet etch or a reactive ion etch. The L-shaped nitride spacer 50A is also removed by the same isotropic etch or by another etch. Further, the thinned disposable nitride layer 55" or the disposable nitride layer 55 is also removed by same isotropic etch, by the same another etch, or by yet another etch. In case each of the thinned second gate cap 46B' or the gate cap 46B, the L-shaped nitride spacer 50A, and the thinned disposable nitride layer 55" or the disposable nitride layer 55 comprises the same nitride material such as silicon nitride, the same etch may be employed to remove all of these structures (46B' or 46B, 50', 55" or 55). The etch employed to remove the thinned disposable nitride layer 55" or the disposable nitride layer 55 is preferably selective to the underlying disposable oxide layer 52.

The disposable oxide layer 52 is thereafter removed by an isotropic etch. Portions of the shallow trench isolation 20, which may comprise an oxide such as silicon oxide, may also be etched to form recessed surfaces. The gate sidewall nitride layer 50 is exposed in the NFET region 100. At this point, the gate sidewall nitride layer 50 encapsulates the first gate stack comprising the first high-k dielectric portion 40A, the first metal gate 42A, the first silicon containing gate conductor 44A, and the first gate cap 46A. The second gate stack comprises the second high-k dielectric portion 40B, the second metal gate 42B, and the second silicon containing gate conductor 44B. The sidewalls and the top surface of the second gate stack are exposed.

Figure 7:
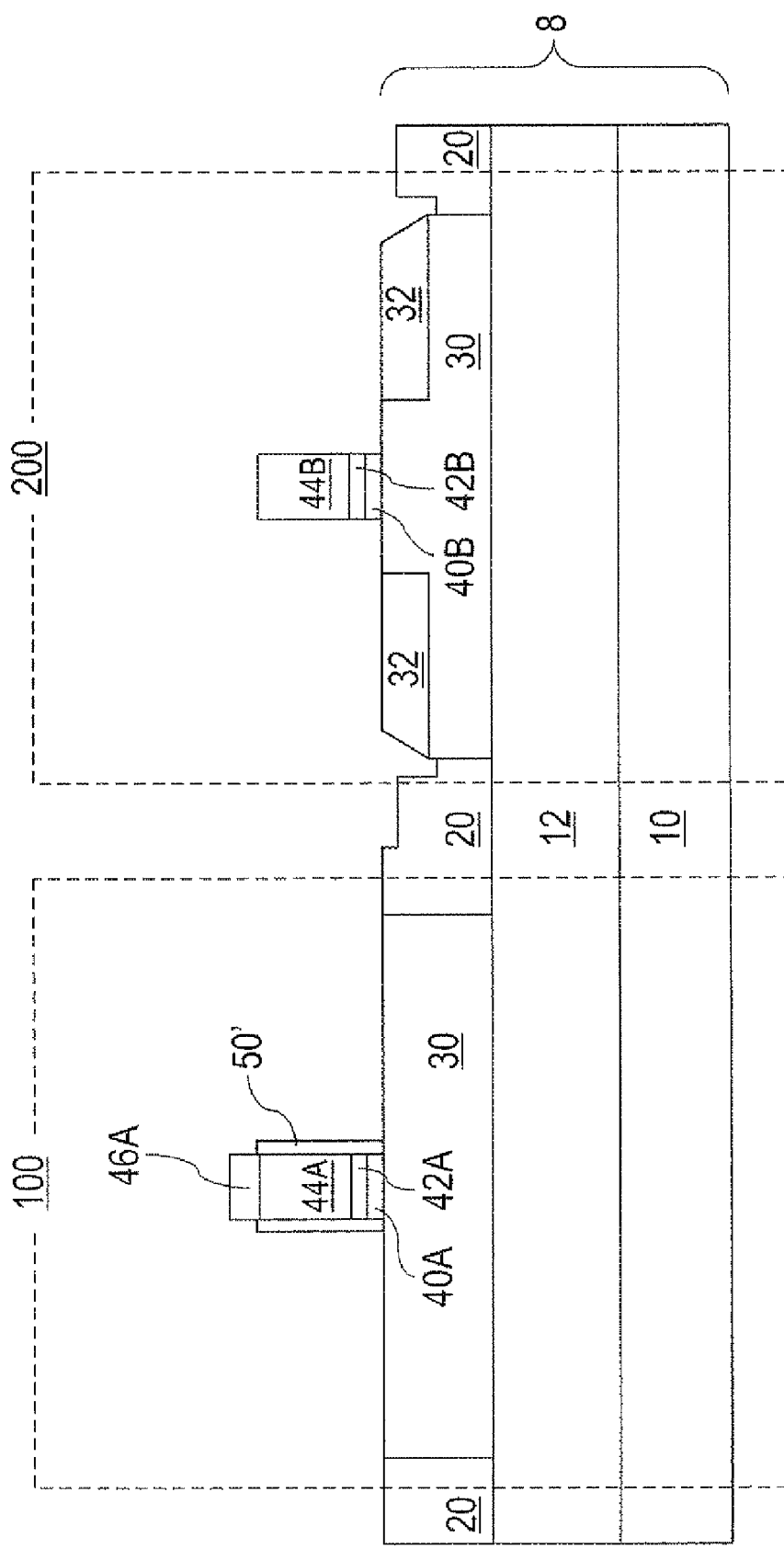

Referring to FIG. 7, a reactive ion etch is performed to remove horizontal portions of the gate sidewall nitride layer 50. Preferably, the reactive ion etch is selective to the top semiconductor layer 30. Remaining portions of the gate sidewall nitride layer 50 on the sidewalls of the first gate stack constitutes a gate sidewall nitride 50'. The thickness of the gate sidewall nitride 50' may be from about 1.5 nm to about 10 nm, and preferably from about 2 nm to about 5 nm.

Masked source and drain extension implantation and/or halo implantation may be performed at this step to form a source and drain extension regions (not shown) if they are not performed in one of prior steps. In general, n-type dopants are implanted into source and drain extension regions in the NFET region 100, and p-type dopants are implanted into source and drain extension regions in the PFET region 200.

Figure 8:
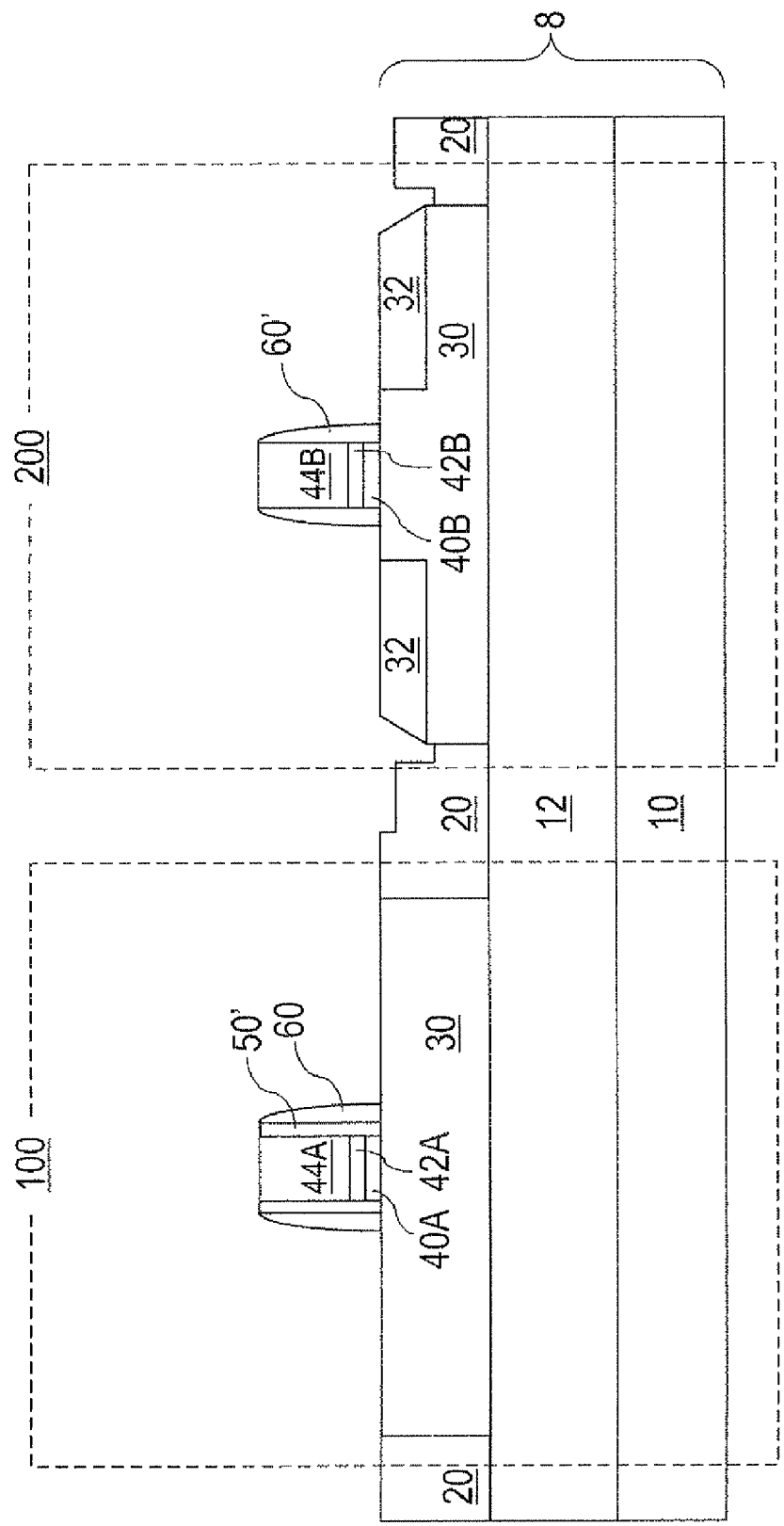

Referring to FIG. 8, the first gate cap 46A is removed, for example, by a wet etch or a reactive ion etch. In case first gate cap 46A comprises silicon nitride, a wet etch employing hot phosphoric acid may be employed. First oxide spacers 60 are formed on substantially vertical surfaces, i.e., on the gate sidewall nitride 50' and on the sidewalls of the second gate stack. The first oxide spacers 60 comprise a dielectric oxide. The first oxide spacers 60 may comprise a silicon oxide such as low temperature oxide (LTO) or tetra-ethyl-ortho-silicate (TEOS) oxide. The first oxide spacers 60 may be formed, for example, by plasma enhanced chemical vapor deposition (PECVD), rapid thermal chemical vapor deposition (RTCVD), or low pressure chemical vapor deposition (LPCVD), followed by a reactive ion etch. The thickness of the first oxide spacers 60 as measured at the bottom, that is, close to the top semiconductor layer 30, may be from about 5 nm to about 30 nm, and preferably from about 10 nm to about 15 nm. Additional doping may be performed in the top semiconductor layer 30 at this point as needed.

Figure 9:
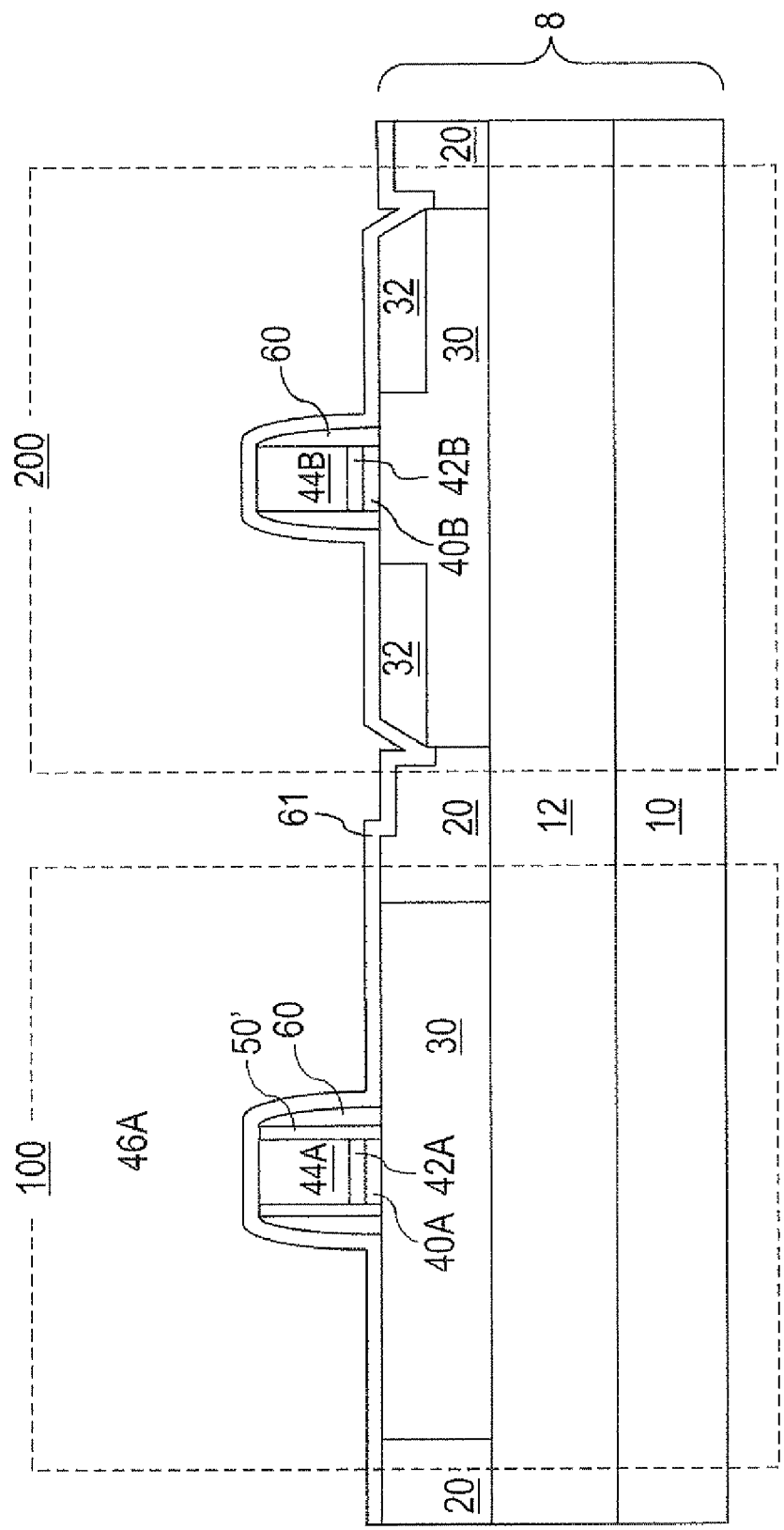

Referring to FIG. 9, an oxide layer 61 may optionally be formed on the first oxide spacers 60, the top surface of the first silicon containing gate conductor 44A, the top surface of the second silicon containing gate conductor 44B, and exposed surfaces of the semiconductor substrate 8. The oxide layer 61 may comprise a silicon oxide such as low temperature oxide (LTO) or tetra-ethyl-ortho-silicate (TEOS) oxide. The oxide layer 61 may be formed, for example, by plasma enhanced chemical vapor deposition (PECVD), rapid thermal chemical vapor deposition (RTCVD), or low pressure chemical vapor deposition (LPCVD). The oxide layer 61 may, or may not, comprise the same oxide as the first oxide spacers. The oxide layer 61 may, or may not, be conformal. The thickness of the oxide layer 61 as measured on the bottom of the first oxide spacers 60 may be from about 3 nm to about 20 nm, and preferably from about 3 nm to about 10 nm.

Figure 10:
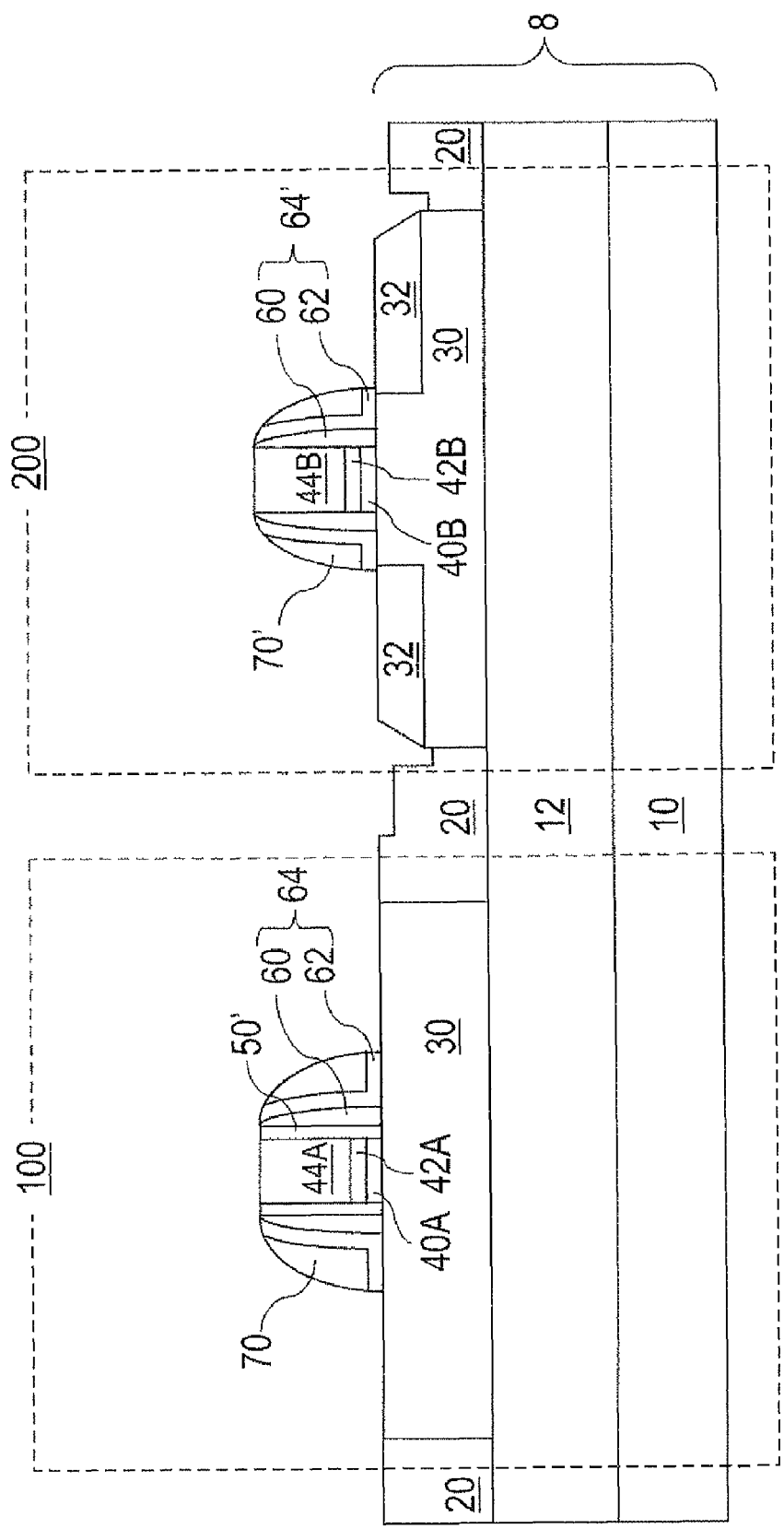

Referring to FIG. 10, outer dielectric spacers 70 are formed on the first gate stack and the second gate stack by deposition of a dielectric layer followed by a reactive ion etch. The outer dielectric spacers 70 comprise a dielectric material, and may comprise a dielectric nitride such as silicon nitride. After formation of the outer gate spacers 70, the reactive ion etch continues to etch exposed portions of the oxide layer 61, e.g., the portions of the oxide layer 61 directly on the top semiconductor layer 30 and the first silicon containing gate conductor 44A. The remaining portions of the oxide layer 61 that are located between one of the outer dielectric spacers 70 and one of the first oxide spacers 60 constitute second oxide spacers 62. The cross-sectional area of the second oxide spacers 62 is L-shaped. The first oxide spacer 60 and the second oxide spacer 62 that are located in the NFET region 100 constitute a NFET oxide spacer 64. The first oxide spacer 60 and the second oxide spacer 62 that are located in the PFET region 200 constitute a PFET oxide spacer 64'. The NFET oxide spacer 64 abuts the gate sidewall nitride 50', a portion of the top semiconductor layer 30 in the NFET region 100, and an outer dielectric spacer 70. The PFET oxide spacer 64' abuts the sidewalk of the second gate stack, another portion of the top semiconductor layer 30 in the PFET region 200, and another outer dielectric spacer 70.

The exemplary semiconductor structure is thereafter subjected to conventional processing steps including an activation anneal. During the activation anneal, the exemplary semiconductor structure is subjected to a high temperature above 800° C., and typically above 950° C. Exposure to such a high temperature affects the composition of the high-k dielectric material, i.e., the first high-k dielectric portion 40A and the second high-k dielectric portion 40B. In general, high temperature processing causes loss of oxygen in dielectric metal oxides by decomposition.

In one embodiment, the first high-k dielectric portion 40A and the second high-k dielectric portion 40B prior to the activation anneal comprise a substantially stoichiometric dielectric metal oxide or a non-stoichiometric dielectric metal oxide selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof. Each of $\alpha$, $\beta$, $\gamma$, $\delta$, $\in$, $\zeta$, $\eta$, and $\theta$ is from about 0.70 to 1.0. In this case, the first high-k dielectric portion 40A and the second high-k dielectric portion 40B after the activation anneal comprise a non-stoichiometric dielectric metal oxide selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof. Each of $\iota$, $\kappa$, $\lambda$, $\mu$, $\nu$, $\xi$, $o$, and $\pi$ is from about 0.70 to about 0.975, and typically from about 0.70 to about 0.90. In general, the first high-k dielectric portion 40A and the second high-k dielectric portion 40B after the activation anneal is less stoichiometric, i.e., contains less oxygen in the compound, than the first high-k dielectric portion 40A and the second high-k dielectric portion 40B prior to the activation anneal. The higher the values of $\alpha$, $\beta$, $\gamma$, $\delta$, $\in$, $\zeta$, $\eta$, $\theta$, $\iota$, $\kappa$, $\lambda$, $\mu$, $\nu$, $\xi$, $o$, and $\pi$ are, the more stoichiometric and the less oxygen deficient is the dielectric metal oxide.

In another embodiment, the first high-k dielectric portion 40A and the second high-k dielectric portion 40B prior to the activation anneal comprise a first alloy of $SiO_2$ and a dielectric metal oxide, substantially stoichiometric or non-stoichiometric, wherein the dielectric metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof. Each of $\alpha$, $\beta$, $\gamma$, $\delta$, $\in$, $\zeta$, $\eta$, and $\theta$ is from about 0.70 to 1.0. In this case, the first high-k dielectric portion 40A and the second high-k dielectric portion 40B after the activation anneal comprise a second alloy of $SiO_2$ and a non-stoichiometric dielectric metal oxide, wherein the non-stoichiometric dielectric metal oxide selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof. Each of $\iota$, $\kappa$, $\lambda$, $\mu$, $\nu$, $\xi$, $o$, and $\pi$ is from about 0.70 to about 0.975, and typically from about 0.70 to about 0.90. The second alloy is less stoichiometric than the first alloy, i.e., contains less oxygen.

Figure 11:
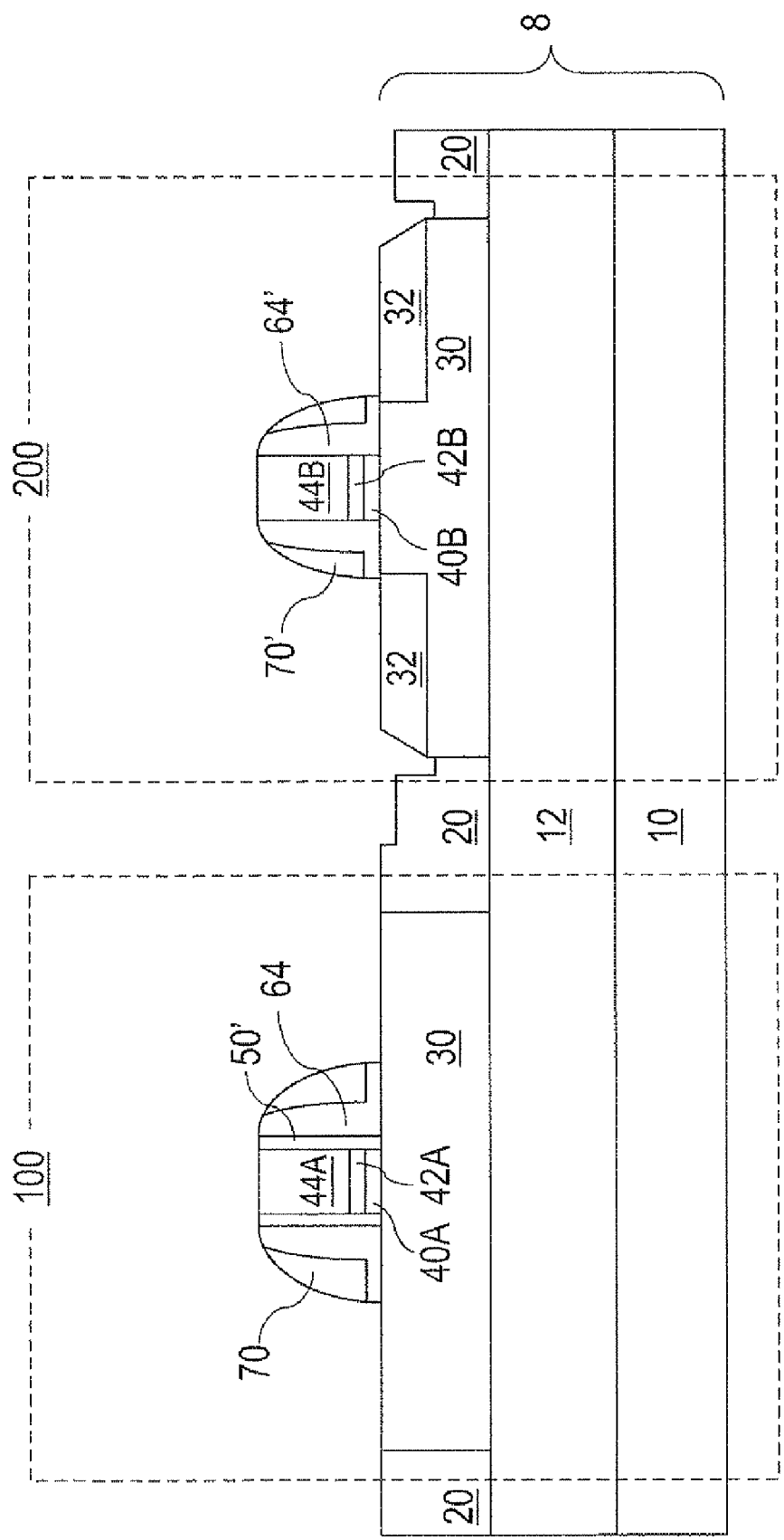

Referring to FIG. 11, the exemplary semiconductor structure after the activation anneal is shown, in which the individual components of the PFET oxide spacer 64 and the NFET oxide spacer 64' are not distinguished. Since both the first oxide spacer 60 and the second oxide spacer 62 comprise an oxide material such as silicon oxide, the PFET oxide spacer 64 and the NFET oxide spacer 64' are oxygen-permeable, i.e., atomic oxygen and/or oxygen molecules may diffuse through the PFET oxide spacer 64 and the NFET oxide spacer 64' freely.

The exemplary semiconductor structure is subjected to an anneal in an oxygen environment. The temperature of the anneal may be from about 300° C. to about 600° C., and preferably from about 400° C. to about 500° C. The oxygen partial pressure may be from 100 mTorr to about 20 atm, and typically about 1 atm. The duration of the anneal may be from about 10 min to about 6 hours. In general, the duration of the anneal decreases with an increase in the anneal temperature and/or the partial pressure of oxygen. An insignificant level of oxidation may occur on exposed semiconductor surfaces, or alternately, a semiconductor oxide with thickness less than 15 nm may be thermally grown on exposed semiconductor surfaces.

Figure 12:
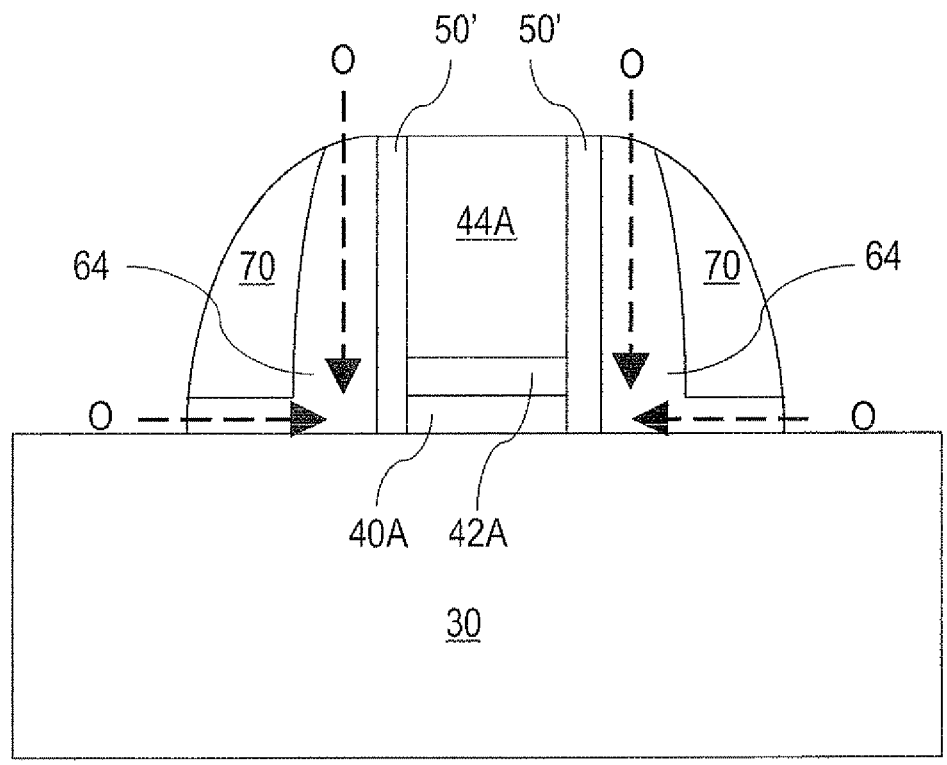
FIG. 12 is a magnified view of a first gate stack in a NFET region of FIG. 11 during an anneal processes in an oxygen ambient.

During the anneal in the oxygen environment, atomic oxygen and/or oxygen molecules diffuse through the oxygen-permeable NFET oxide spacer 64 and the PFET oxide spacer 64'. The effects of the diffusion of the atomic oxygen and/or oxygen molecules on the first gate stack and the second gate stack are illustrated in the magnified views of the first and second gate stack in FIGS. 12 and 13, respectively. In the first gate stack shown in FIG. 12, the gate sidewall nitride 50' located directly on the sidewalls of the first gate stack prevents the atomic oxygen and/or oxygen molecules from diffusing into the first gate dielectric portion 40A. While the atomic oxygen and/or oxygen molecules can diffuse through the NFET oxide spacer 64, the atomic oxygen and/or oxygen molecules are effectively blocked by the gate sidewall nitride 50' and the top semiconductor layer 30. Thus, increase in oxygen content in the first high-k dielectric portion 40A is insignificant.

Figure 13:
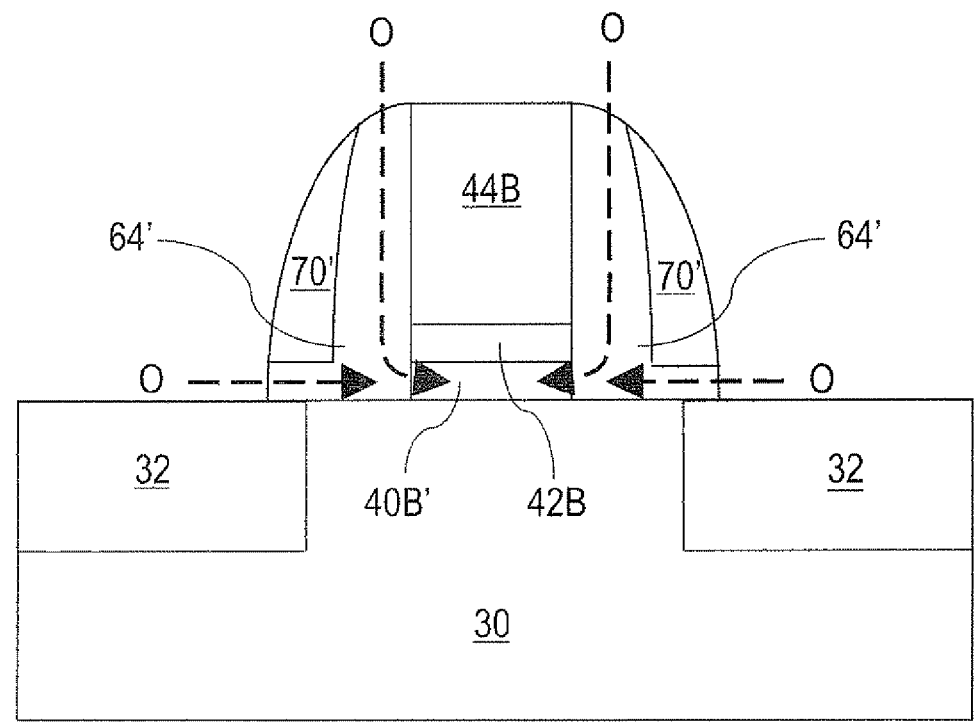
FIG. 13 is a magnified view of a second gate stack in an PFET region of FIG. 11 during the anneal processes in the oxygen ambient.

In the second gate stack shown in FIG. 13, the PFET oxide spacer 64' abuts the sidewalls of the second gate stack including the sidewalls of the second high-k dielectric portion 40B. Thus, the atomic oxygen and/or oxygen molecules diffuse freely through PFET oxide spacer 64 and is incorporated into the second high-k dielectric portion 40B. The oxygen content of the second high-k dielectric portion 40B increases relative to the oxygen content of the first high-k dielectric portion 40A. The process conditions of the anneal are selected to increase in the oxygen content in the second high-k dielectric portion 40A by a significant amount.

In one embodiment, the first high-k dielectric portion 40A and the second high-k dielectric portion 40B after the activation anneal comprise a non-stoichiometric dielectric metal oxide selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof. Each of $\iota$, $\kappa$, $\lambda$, $\mu$, $\nu$, $\xi$, o, and $\pi$ is from about 0.70 to about 0.975, and typically from about 0.70 to about 0.90. The first high-k dielectric portion 40A after the anneal in the oxygen environment comprises substantially the same material as prior to the anneal, i.e., a non-stoichiometric dielectric metal oxide selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof, wherein each of $\iota$, $\kappa$, $\lambda$, $\mu$, $\nu$, $\xi$, o, and $\pi$ is from about 0.70 to about 0.975, and typically from about 0.70 to about 0.90. However, the second high-k dielectric portion 40B after the anneal in the oxygen environment comprises a dielectric metal oxide having a higher oxygen concentration. For example, the second high-k dielectric portion 40B after the anneal may be a dielectric metal oxide selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof. Each of $\alpha$, $\beta$, $\gamma$, $\delta$, $\in$, $\zeta$, $\eta$, and $\theta$ is from about 0.90 to 1.0. Further, the second high-k dielectric portion 40B after the anneal may be a substantially stoichiometric dielectric metal oxide selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha$, $\beta$, $\gamma$, $\delta$, $\in$, $\zeta$, $\eta$, and $\theta$ is from about 0.975 to 1.0.

In another embodiment, the first high-k dielectric portion 40A and the second high-k dielectric portion 40B after the activation anneal comprise an alloy of $SiO_2$ and a non-stoichiometric dielectric metal oxide, wherein the non-stoichiometric dielectric metal oxide selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof. Each of $\iota$, $\kappa$, $\lambda$, $\mu$, $\nu$, $\xi$, o, and $\pi$ is from about 0.70 to about 0.975, and typically from about 0.70 to about 0.90. The first high-k dielectric portion 40A after the anneal in the oxygen environment comprises substantially the same material as prior to the anneal, i.e., the alloy of $SiO_2$ and the non-stoichiometric dielectric metal oxide, wherein the non-stoichiometric dielectric metal oxide selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\xi}$, $LaAlO_{3o}$, $Y_2O_{3\pi}$ and an alloy thereof, and wherein each of $\iota$, $\kappa$, $\lambda$, $\mu$, $\nu$, $\xi$, o, and $\pi$ is from about 0.70 to about 0.975, and typically from about 0.70 to about 0.90. However, the second high-k dielectric portion 40B after the anneal in the oxygen environment comprises another alloy of $SiO_2$ and another dielectric metal oxide having a higher oxygen concentration. For example, the second high-k dielectric portion 40B after the anneal may be an alloy of $SiO_2$ and a dielectric metal oxide selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha$, $\beta$, $\gamma$, $\alpha$, $\beta$, $\gamma$, $\delta$, $\in$, $\zeta$, $\eta$, and $\theta$ is from about 0.90 to 1.0. Further, the dielectric metal oxide within the alloy of the second high-k dielectric portion 40B may be a substantially stoichiometric dielectric metal oxide selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha$, $\beta$, $\gamma$, $\delta$, $\in$, $\zeta$, $\eta$, and $\theta$ is from about 0.975 to 1.0.

Conventional semiconductor processing steps such as silicide formation, optional formation of stress-generating liners, formation of mobile ion barrier dielectric layer such as a silicon nitride layer, formation of middle-of-line gate dielectric, and formation of contacts to various components of the exemplary semiconductor structures are performed.

The inventive semiconductor structure provides two types of high-k gate dielectric portions. The second high-k dielectric portion 40B contains more oxygen and is more stoichiometric than the first high-k dielectric portion 40A. Thus, the first high-k dielectric portion 40A may advantageously be employed to form a first type of transistor such as an NFET, and the second high-k dielectric portion 40B may advantageously be employed to form a second type of transistor such as a PFET.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
 a first field effect transistor including:
  a first high-k dielectric portion vertically abutting a semiconductor substrate;
  a first metal gate vertically abutting said first high-k dielectric portion;
  a first silicon containing gate conductor vertically abutting said first metal gate; and
  an oxide spacer laterally abutting said first metal gate and said first silicon containing gate conductor; and
 a second field effect transistor including:
  a second high-k dielectric portion vertically abutting said semiconductor substrate, wherein said first high-k dielectric portion comprises a first dielectric metal oxide containing a metal and said second high-k dielectric portion comprises a second dielectric metal oxide containing the same metal;
  a second metal gate vertically abutting said second high-k dielectric portion;
  a second silicon containing gate conductor vertically abutting said second metal gate; and
  a gate sidewall nitride laterally abutting said second metal gate and said second silicon containing gate conductor, wherein said second high-k dielectric portion is more stoichiometric than said first high-k dielectric portion.

2. The semiconductor structure of claim 1, wherein said second dielectric metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha$, $\beta$, $\gamma$, $\delta$, $\in$, $\zeta$, $\eta$, and $\theta$ is from about 0.975 to 1.0, wherein said first dielectric metal oxide is selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\in}$, $LaAlO_{3o}$, $Y_2O_{3\pi}$ and an alloy thereof, and wherein each of $\iota$, $\kappa$, $\nu$, o, and $\pi$ is from about 0.70 to about 0.975.

3. The semiconductor structure of claim 1, wherein said second dielectric metal oxide is an alloy of $SiO_2$ and a second metal oxide, wherein said second metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha$, $\beta$, $\gamma$, $\delta$, $\in$, $\zeta$, $\eta$, and $\theta$ is from about 0.975 to 1.0, wherein said first dielectric metal oxide is an alloy of $SiO_2$ and a first metal oxide, wherein said first metal oxide is selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\in}$, $LaAlO_{3o}$, $Y_2O_{3\pi}$ and an alloy thereof, and wherein each of $\iota$, $\kappa$, $\lambda$, $\mu$, $\nu$, $\in$, $o$, and $\pi$ is from about 0.70 to about 0.975.

4. The semiconductor structure of claim 1, wherein said second dielectric metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha$, $\beta$, $\gamma$, $\delta$, $\in$, $\zeta$, $\eta$, and $\theta$ is from about 0.90 to 1.0, wherein said first dielectric metal oxide is selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\in}$, $LaAlO_{3o}$, $Y_2O_{3\pi}$ and an alloy thereof, and wherein each of $\iota$, $\kappa$, $\lambda$, $\mu$, $\nu$, $\in$, $o$, and $\pi$ is from about 0.70 to about 0.90.

5. The semiconductor structure of claim 1, wherein said second dielectric metal oxide is an alloy of $SiO_2$ and a second metal oxide, wherein said second metal oxide is selected from the group consisting of $HfO_{2\alpha}$, $ZrO_{2\beta}$, $La_2O_{3\gamma}$, $Al_2O_{3\delta}$, $TiO_{2\in}$, $SrTiO_{3\zeta}$, $LaAlO_{3\eta}$, $Y_2O_{3\theta}$ and an alloy thereof, wherein each of $\alpha$, $\beta$, $\gamma$, $\delta$, $\in$, $\zeta$, $\eta$, and $\theta$ is from about 0.90 to 1.0, wherein said first dielectric metal oxide is an alloy of $SiO_2$ and a first metal oxide, wherein said first metal oxide is selected from the group consisting of $HfO_{2\iota}$, $ZrO_{2\kappa}$, $La_2O_{3\lambda}$, $Al_2O_{3\mu}$, $TiO_{2\nu}$, $SrTiO_{3\in}$, $LaAlO_{3o}$, $Y_2O_{3\pi}$ and an alloy thereof, and wherein each of $\iota$, $\kappa$, $\lambda$, $\mu$, $\nu$, $\in$, $o$, and $\pi$ is from about 0.70 to about 0.90.

6. The semiconductor structure of claim 1, further comprising another oxide spacer laterally abutting said gate sidewall nitride, wherein said oxide spacer and said another oxide spacer comprises the same material.

7. The semiconductor structure of claim 6, wherein said oxide spacer comprises silicon oxide.

8. The semiconductor structure of claim 1, wherein said gate sidewall nitride comprises silicon nitride.

9. The semiconductor structure of claim 1, wherein each of said first metal gate and said second metal gate comprises a material selected from the group consisting of TaN, TiN, WN, TiAlN, TaCN, other conductive refractory metal nitride, and an alloy thereof.

10. The semiconductor structure of claim 9, wherein said first metal gate and said second metal gate comprise the same material.

11. The semiconductor structure of claim 1, wherein said semiconductor substrate comprises silicon and said first silicon containing gate conductor comprises heavily n-doped polysilicon and said second silicon containing gate conductor comprises heavily p-doped polysilicon.

12. A semiconductor structure comprising:
a first field effect transistor including:
   a first high-k dielectric portion vertically abutting a semiconductor substrate;
   a first metal gate vertically abutting said first high-k dielectric portion;
   a first silicon containing gate conductor vertically abutting said first metal gate; and
   an oxide spacer laterally abutting said first metal gate and said first silicon containing gate conductor; and
a second field effect transistor including:
   a second high-k dielectric portion vertically abutting said semiconductor substrate;
   a second metal gate vertically abutting said second high-k dielectric portion;
   a second silicon containing gate conductor vertically abutting said second metal gate, wherein each of said first metal gate and said second metal gate comprises a material selected from the group consisting of TaN, TiN, WN, TiAlN, TaCN, other conductive refractory metal nitride, and an alloy thereof; and
   a gate sidewall nitride laterally abutting said second metal gate and said second silicon containing gate conductor, wherein said second high-k dielectric portion is more stoichiometric than said first high-k dielectric portion.

\* \* \* \* \*